United States Patent
McKinnell et al.

(10) Patent No.: US 7,454,221 B1
(45) Date of Patent: Nov. 18, 2008

(54) ELECTRON TUBE AMPLIFICATION

(75) Inventors: James C. McKinnell, Salem, OR (US); John Paul Harmon, Albany, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 645 days.

(21) Appl. No.: 11/179,260

(22) Filed: Jul. 12, 2005

(51) Int. Cl.
*H04B 7/00* (2006.01)
*H04B 1/28* (2006.01)

(52) U.S. Cl. .................... 455/514; 455/333; 455/550.1

(58) Field of Classification Search .................. 455/514, 455/550.1, 331, 329, 333; 250/396 R, 396 ML, 250/492.2, 492.3; 369/100, 101
See application file for complete search history.

(56) References Cited

U.S. PATENT DOCUMENTS

| | | | |
|---|---|---|---|
| 6,400,090 B2* | 6/2002 | Katsap et al. | 315/111.81 |
| 6,704,267 B2 | 3/2004 | Davidson | |
| 6,741,016 B2* | 5/2004 | Benning et al. | 313/309 |
| 6,781,146 B2* | 8/2004 | Benning et al. | 257/10 |
| 6,806,488 B2 | 10/2004 | Ramamoorthi et al. | |
| 7,044,823 B2* | 5/2006 | Chen et al. | 445/50 |
| 7,170,223 B2* | 1/2007 | Smith et al. | 313/495 |
| 7,205,559 B2* | 4/2007 | Hamashima et al. | 250/492.3 |
| 2005/0017624 A1* | 1/2005 | Novet et al. | 313/311 |

OTHER PUBLICATIONS

Bower et al., "On-Chip Vacuum Microtriode using Carbon Nanotube field emitters", Applied Physics Letters. Vol. 80, No. 20, May 20, 2002, pp. 3820.

* cited by examiner

*Primary Examiner*—Sonny Trinh

(57) ABSTRACT

An amplification apparatus is disclosed. The amplification apparatus includes a plurality of emitters formed on a first substrate, an anode formed adjacent to a second substrate, so that current can be conducted between the emitters of the first substrate and the anode of the second substrate. A lens is formed adjacent to the emitters for controlling a magnitude of the current, thereby providing amplification of a signal applied to the lens. An inter-substrate material connects the first substrate and the second substrate, forming a vacuum that includes the emitters, the anode and the lens. Either the first substrate or the second substrate includes solid state memory. An alternate embodiment includes a storage medium for receiving an electron beam from the electron emitter, the storage medium having a storage area, the storage area being in one of a plurality of states as determined by an electron beam generated by the electron emitter.

12 Claims, 10 Drawing Sheets

STORING DATA IN A PHASE CHANGE MEDIUM THAT IS PROXIMATE TO THE ELECTRON EMITTERS BY EXPOSING THE PHASE CHANGE MEDIUM TO AN ELECTRON BEAM CURRENT TO CHANGE A STATE OF THE PHASE CHANGE MEDIUM

1010

AMPLIFYING AN ELECTRONIC SIGNAL BY APPLYING THE ELECTRONIC SIGNAL TO A GRID THAT CONTROLS A MAGNITUDE OF CURRENT FLOWING BETWEEN THE ELECTRON EMITTERS AND A CATHODE THAT RECEIVES ELECTRONS FROM THE ELECTRON EMITTERS

ELECTRON TUBE AMPLIFICATION

FIELD OF THE INVENTION

The invention relates generally to electronics. More particularly, the invention relates to an apparatus and method of electron tube signal amplification.

BACKGROUND OF THE INVENTION

Portable computing devices are becoming more prevalent. The portable computing devices typically communicate with networks (telephone and computer) through wireless transmission channels. The portable computing devices receive and transmit wireless signals that are modulated with transmission information (typically data). The wireless signals can suffer from varying levels of attenuation during transmission. One way to mitigate the effects of transmission attenuation is to amplify the signals before transmission.

Portable computing devices typically include memory. The amount of memory required by portable computing devices is continually increasing as more complex processing applications are becoming available. The portable computing devices are becoming more computer-like as the processing power and memory capacities of the portable computing devices increases. More complex applications can require mass memory for proper operation.

As portable computing devices are sold in greater volumes, competitive market pressures are forcing the cost of portable computing devices to continually decrease. The costs associated with portable computing devices can be reduced by minimizing the number of integrated circuits required by the portable computing devices. Typically, electronic circuitry that provides signal amplification and electronic circuitry that provides memory storage are located on separate integrated circuits, forcing multiple integrated circuits to exist within portable computing devices requiring signal amplification for wireless transmission, and mass memory storage as required by most useful processing applications.

The amplifiers used in portable devices for amplifying transmission signals should be designed to be as efficient a possible. Increasing the efficiency can increase the available output power of the amplifiers, or minimize the amount of power required to provide a transmission signal having a required or desired power level.

Portable computing devices typically include batteries for powering the electronic circuitry within the portable computing devices. To conserve power, the electronic circuitry is desirably designed for maximal power efficiency to consume as little power as possible to maximize battery life.

The challenge of manufacturing portable communications devices includes balancing the needs for signal amplification, mass memory storage, low-cost and low power dissipation. Ideally, all of these needs are met while minimizing the number of integrated circuits within the communication devices.

It is desirable to have an apparatus and method of providing mass storage and signal amplification using a minimal number of integrated circuits and at a minimal cost.

SUMMARY OF THE INVENTION

An embodiment of the invention includes an amplification apparatus. The amplification apparatus includes a plurality of emitters formed on a first substrate, an anode formed adjacent to a second substrate, so that current can be conducted between the emitters of the first substrate and the anode of the second substrate. A lens is formed adjacent to the emitters for controlling a magnitude of the current, thereby providing amplification of a signal applied to the lens. An inter-substrate material connects the first substrate and the second substrate, forming a vacuum that includes the emitters, the anode and the lens. Either the first substrate or the second substrate includes solid state memory.

Another embodiment of the invention includes a memory storage and amplification apparatus. The apparatus includes an electron emitter, a storage medium for receiving an electron beam from the electron emitter, the storage medium having a storage area, the storage area being in one of a plurality of states as determined by the electron beam generated by the electron emitter. An anode receives an electron beam from the electron emitter, causing an electrical current to flow between the anode and the electron emitter. A lens modulates a magnitude of the electrical current flowing between the anode and the electron emitter.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 10 is a flow chart that includes steps of a method for storing data and amplifying signals within a common vacuum structure.

DETAILED DESCRIPTION

The invention includes an electron tube amplifier and associated mass memory. The electron tube amplifier can be configured to share a vacuum with a mass storage atomic resolution device.

Figure 1:
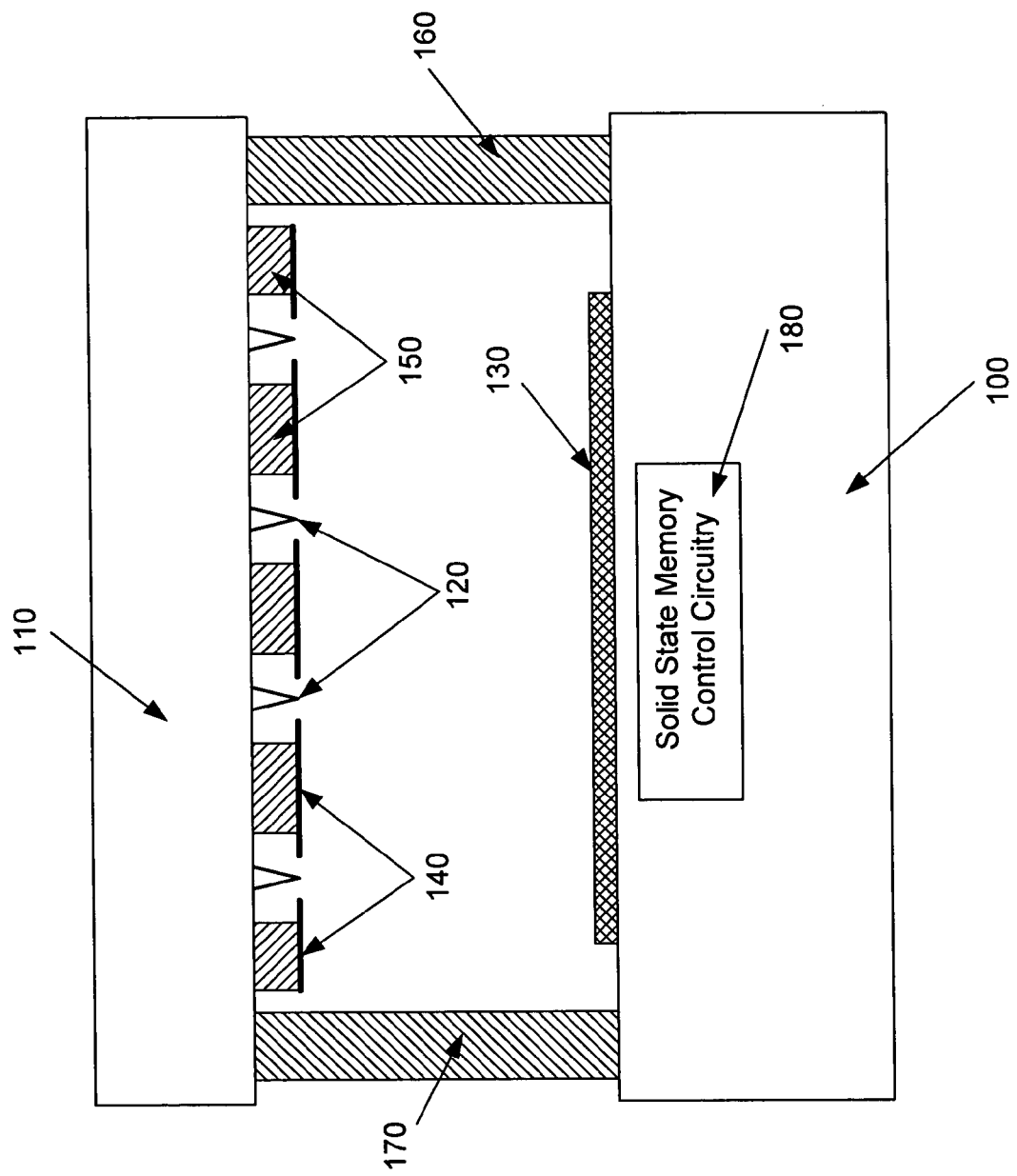
FIG. 1 shows a vacuum tube amplifier and associated electronic memory.

FIG. 1 shows a vacuum tube amplifier and associated electronic memory. The vacuum is formed by a first substrate 100, a second substrate 110 and spacers 160, 170. An electronic tube is formed within the vacuum by electron emitters 120 formed on the second substrate 110, an anode 130 formed on the first substrate 100 and grid elements (the grid elements can also be referred to as lens elements) 140 formed adjacent to the electron emitters 120. Current conducted between the electron emitters 120 and the anode 130 can be modulated by applying a signal to the grid elements (lens elements) 140. Applying a signal to the grid elements 140, results in an amplified version of the signal being conducted between the electron emitters 120 and the anode 130. A dielectric 150 helps in the formation of the emitters and the grid elements.

The tube structure of FIG. 1 includes multiple emitters 120. The multiple emitter structure can provide greater current flow between the emitters 120 and the anode 130 than a single emitter structure. The result can be a greater power amplifier due to higher current flow, allowing for greater signal amplification than a single emitter structure.

The embodiment of FIG. 1 advantageously provides signal amplification that can be proximate to substrates 100, 110, which can include mass memory 180 (for example, solid state memory). The substrates 100, 110 can also include communication signals both before and after amplification. The tube amplifier can be formed over the memory (that is, if the memory 180 is located in the first substrate 100), and essentially occupy a common footprint as the memory 180. The tube amplifier is formed over the memory 180, and therefore, does not require additional surface area of the first substrate. The resulting structure provides an amplifier and mass storage that can be included within a compact structure, which is ideal for wireless communication devices.

The substrates 100, 110 can be formed from silicon or any other commonly used substrate material. The memory 180 can include any commonly used solid state memory, such as DRAM, SRAM, EEPROM or flash. The metal layer 130 can be formed from a commonly used conductive material, such as aluminum. The spacers 160, 170 are typically formed of a bonding material. The spacers 160, 170 provide a wafer to wafer (substrate to substrate) bond forming an internal cavity. Conductive materials (for example, conductive solders) can advantageously be used to form the spacers 160, 170, thereby providing conductive interconnection paths between the substrates 100, 110. Additional spacers (not shown) can provide additional first substrate 100 to second substrate 110 conductive path interconnections. These additional spacers are not necessary for forming the vacuum. A vacuum is formed within the internal cavity by sealing the cavity at high vacuum. A getter material can be included within the vacuum to maintain a pure vacuum within the cavity.

The emitters 120, the grid elements 140 and the dielectric 150 are formed from standard semiconductor patterning over, for example, the second substrate 110. These elements provide for focusing and modulation of the electron stream being emitted from the emitters 120. After formation, the second substrate can be placed over the first substrate, and attached through the spacers 160, 170. Exemplary spacers include solder traces. A vacuum can be formed between the first substrate 100 and the second substrate 110 by attaching the substrates in a vacuum. The metal layer 130 can be formed over the first substrate 100 through standard semiconductor patterning and processing.

Tube Amplification

Vacuum tubes include a heated cathode (emitters of FIG. 1) that emits electrons into a vacuum. The electrons pass through a grid which controls the electron current flow through the tubes. The electrons then strike the anode (plate) and are absorbed. By designing the cathode, grid(s) and plate properly, the tube makes a small AC signal voltage into a larger AC voltage, thus amplifying it. As shown in FIG. 1, the electron emitters 120 generate electrons which are conducted through the vacuum formed by the first substrate 100, the second substrate 110, spacers 160, 170, and strike the anode 130 formed on the first substrate 100. Tube amplifiers are typically more efficient than solid state amplifiers. This is very desirable in portable devices, because more efficient transmission signal amplification can provide signals with greater power levels. Alternatively, more efficient transmission signal amplification can provide signals with a required or desired signal power while dissipating less power. Portable devices typically are powered with batteries. Therefore, less power dissipation is desirable.

The first substrate 100 and the second substrate 110 can include electronic circuitry that includes communications signals. The vacuum tube amplifier can provide amplification of the communication signals. The substrates 100, 110 can also include solid-state memory. Exemplary types of solid state memory include DRAM, SRAM, EEPROM or flash. The structure of FIG. 1 provides the unique combination of efficient, low power signal amplification, and mass memory storage (for example, solid state memory), all within a compact package.

Figure 2:
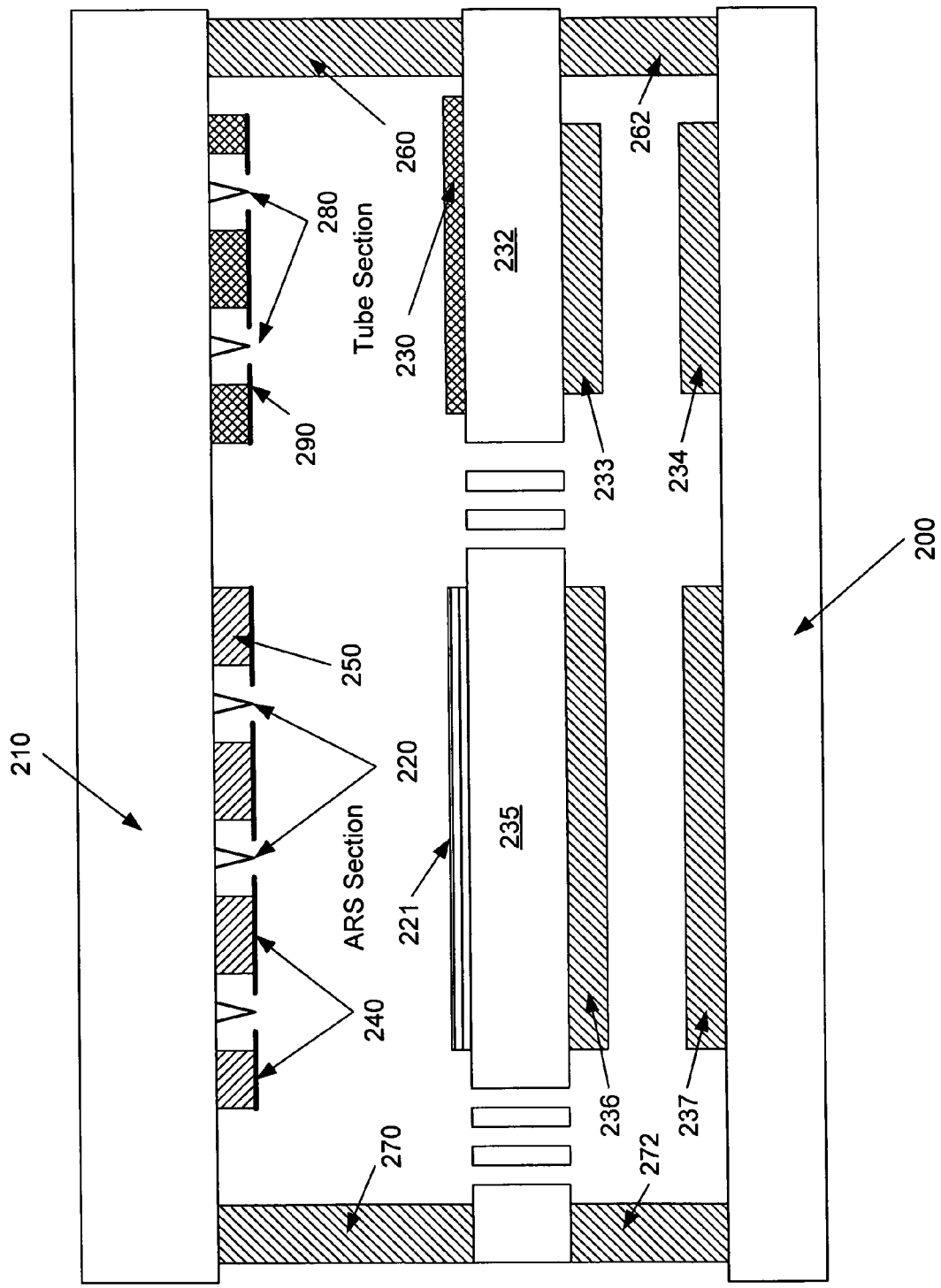
FIG. 2 shows a vacuum tube amplifier and associated atomic resolution storage (ARS) located within a common vacuum.

FIG. 2 shows a vacuum tube amplifier and associated atomic resolution storage (ARS) located within a common vacuum. ARS is a storage technology that includes a number of electron emitters 220, such as field emitters, that are adapted to write data to and read data from various storage areas of a storage medium 221. The vacuum can be formed between a first substrate 200, a second substrate 210 and spacers 260, 262, 270, 272. A tube amplifier is also formed within the vacuum by emitters 280, grids (lens) 290 and anode 230.

The storage medium 221 is formed over a moveable micro-mover 235. Drive electrodes 236, 237 enable precise movement of the micro-mover 235 providing alignment of the electron emitters 220 to memory areas of the storage medium 221. The drive electrodes 236, 237 can be implemented to form a stepper motor as is known in the art. Controls of the micro-mover can be located within the second substrate 200, and operate to align the electron emitters 220 over precise storage areas of the storage medium 221, allowing data to be stored and read from each of many storage areas of the storage medium 221. The storage medium can be formed of a phase-change medium as will be described.

As shown in FIG. 2, an electron tube amplifier is formed by emitters 280, an anode 230 and grids 290. The emitters 280 and the grids 290 are formed over the second substrate 210. The anode 290 is formed over an anode substrate 232.

The spacers 260, 262, 270, 272 provide the formation of a vacuum cavity. The spacers 260, 262, 270, 272 can be conductive, and therefore, also provide conductive paths between the substrates 200, 210. Additional spacers can be included to provide additional conductive paths between the substrates 200, 210.

FIG. 2 also includes getter material 233, 234. The getter material is included for the purpose of soaking up gas caused by leaks or out gassing, to maintain the vacuum within the cavity.

As previously described, the emitters 220, grid elements 240 and dielectric 250 are formed from standard semiconductor patterning over, for example, the second substrate 210. These elements provide for focusing and modulation of the electron stream being emitted from the emitters 220. After formation, the second substrate 210 can be placed over the first substrate 210, and attached through the spacers 260, 262, 270, 272. Exemplary spacers include solder traces. A vacuum can be formed between the first substrate 200 and the second substrate 210 by attaching the substrates in a vacuum. The anode 230 and the storage medium can be formed through standard semiconductor patterning and processing.

The tube section and the ARS memory section are formed in a common vacuum, and proximate to common substrates. This combined structure provides an amplification and memory storage structure that is compact and inexpensive.

ARS Storage

During operation of ARS storage, an electron beam current is extracted from an emitter towards a corresponding storage area. Writing of data from an emitter to a storage area is accomplished by temporarily increasing the power density of the electron beam current to modify the structural state of the surface of the storage area. In contrast, reading data from the storage area is accomplished by observing the effect of the storage area on the electron beam of the emitter, or the effect of the electron beam on the storage area. More specifically, reading is typically accomplished by sensing current flow through a storage area when an electron beam, such as an electron beam with a lower power density than that of the electron beam utilized for writing data to the storage area, is applied to the storage medium.

An ARS storage medium (for example, a phase change medium) is formed of material characterized by a structural state that can be changed from crystalline to amorphous by a beam of electrons. Changing from the amorphous state to the crystalline state requires increasing the beam power density and then slowly decreasing the beam power density. This process heats up the amorphous area and then slowly cools the area so that the area has time to anneal into a crystalline state. Changing from the crystalline state to the amorphous state requires increasing the beam power density to a high level and then rapidly decreasing the beam power density. A lower level beam power density strikes the storage area when reading from the storage area. Exemplary storage medium materials include germanium telluride (GeTe) and ternary alloys based on GeTe.

Figure 3:
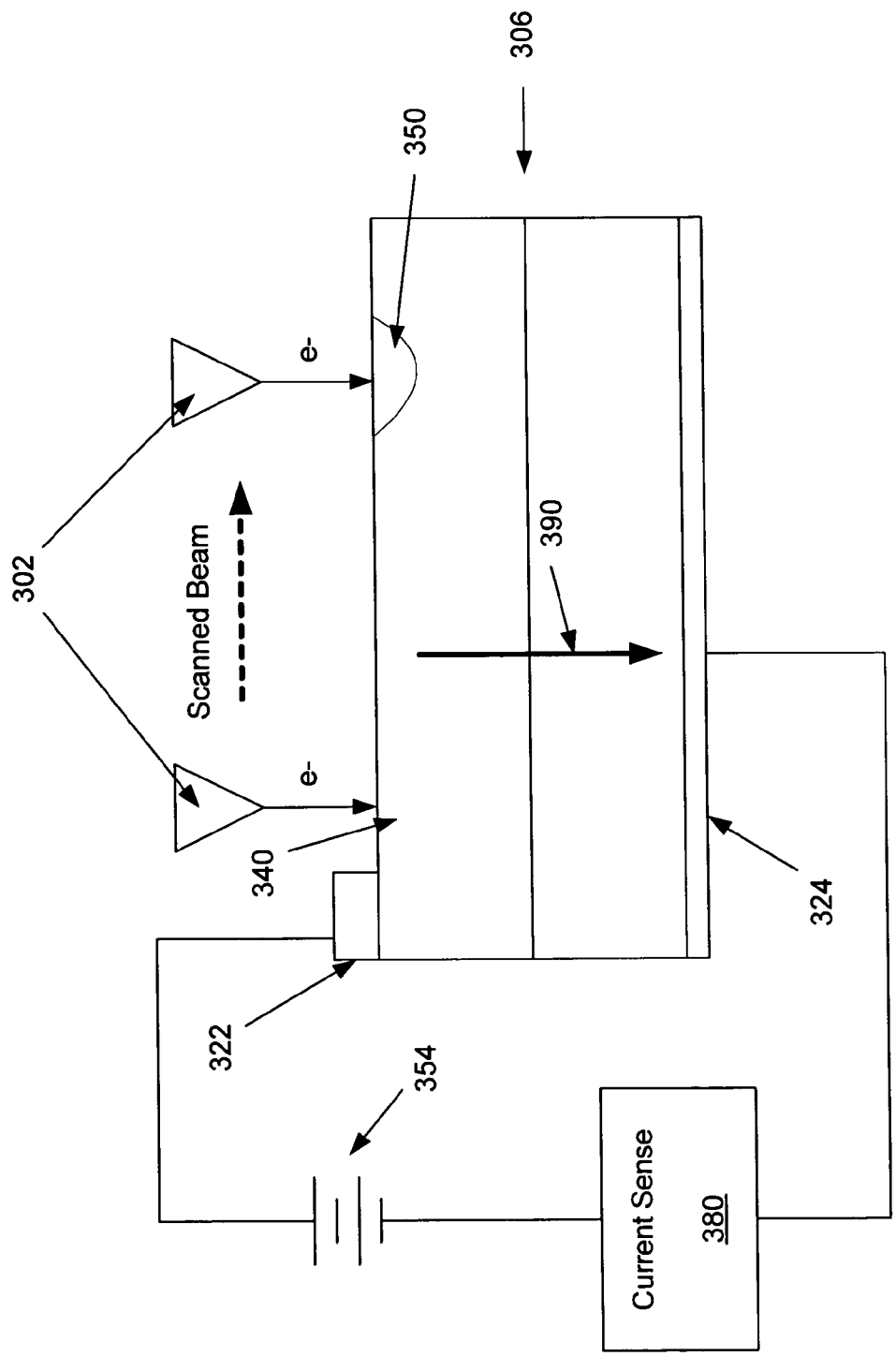
FIG. 3 shows electron emitters reading from storage areas.

FIG. 3 shows a field emitter 302 being used to read storage areas 340, 350 from a storage medium 306. A state of one storage area 350 has been altered, while the state of another storage area 340 has not. As shown, an electron beam generated by the emitter 302 is scanned across the surface of the storage medium 306 allowing detection of states of the storage areas 340, 350 within the surface of the storage medium 306.

To write an amorphous bit to a storage area, a high-power electron beam from emitter 302 is used to melt-quench a small region at the surface of the phase change medium storage area. For erasure, a lower power electron beam heats the storage area above its crystalline temperature.

To read data back, an electron beam from the emitter 302 is scanned over storage areas 340, 350 of the surface of the phase change storage medium 306 at a power density insufficient to cause erasure. The electron beam generates electron hole pairs within the storage medium. A pn-junction within the storage medium is reverse biased by a voltage source 354 connected to conductive contacts 322, 324. Minority carriers are swept across the pn-junction creating a current that can be sensed by a current sensor 380. In amorphous regions (such as storage area 350) minority carrier mobility is low and their lifetime is short due to the high density of recombination sites. Consequently, when the beam is incident on an amorphous bit, the efficiency in which the generated carriers are collected is low. As a result, the current 390 sensed by the current sensor 380 is lower for amorphous regions than for crystalline regions, allowing detection of bits stored within the storage areas 340, 350.

ARS storage methods within phase change mediums are also set forth and described in U.S. Pat. Nos. 5,557,596, 6,704,267 and are herein incorporated by reference.

Electron, Emitters, and Emission Control

Figure 4:
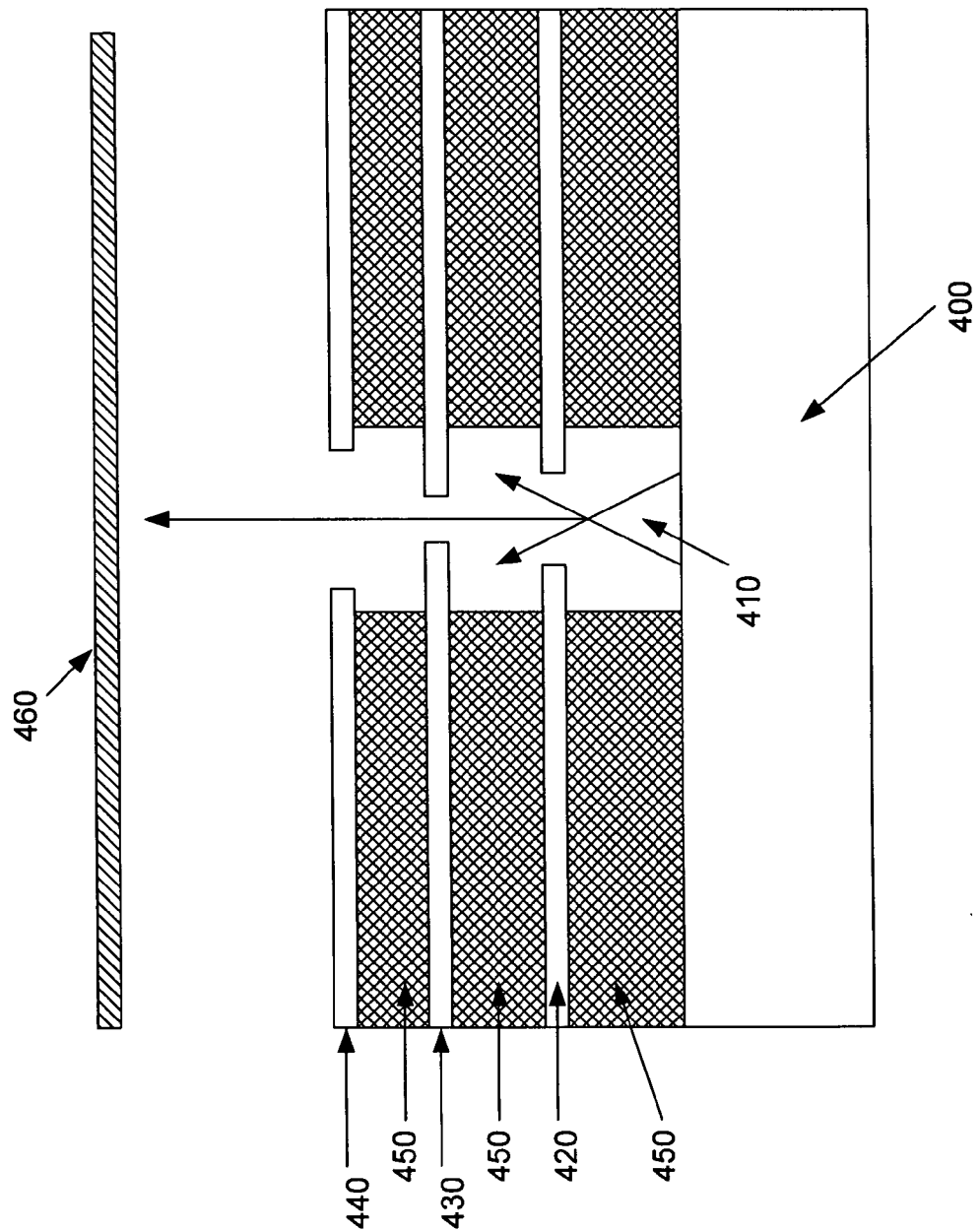
FIG. 4 shows a greater detail of an electron emitter structure.

FIG. 4 shows a greater detail of an electron emitter structure. The emitter structure includes an emitter 410 formed over a substrate 400. A gate layer 420 is formed over the substrate 400, and includes an opening over the emitter 410. An aperture layer 430 is formed over the gate layer 420, and also includes an opening over the emitter 410. A lens layer 440 is formed over the aperture layer 430 that also includes an opening over the emitter. The layers 420, 430, 440 are separated by insulating layers 450. The electron emitter structure generates a focused electron beam that is focused on a surface 460 that can be a phase change media for memory storage, or an anode for tube amplification.

The electron emitter structure of FIG. 4 generates an electron beam having a small diameter (spot size). The gate layer 420 is positively biased relative to the emitter 410. The majority of emitted electrons travel perpendicular to the gate layer 420. However, some fraction of the emitted electrons travel in a direction having an angle sufficiently away from the main beam (majority of emitted electrons) that these electrons can not be focused to the desired spot size. These electrons are intercepted by the aperture layer 430. The main electron beam (majority of emitted electrons) that travel through the aperture of the aperture layer 430 is focused into a small diameter beam by applying a small negative bias to the lens layer, which compresses the beam.

The electron emitter structure of FIG. 4 is typically used for emitters that read and write to storage media. The efficiency of emitters that emit electrons to anodes can maximized by eliminating the aperture layer 430 and the lens layer 440.

Figure 5:
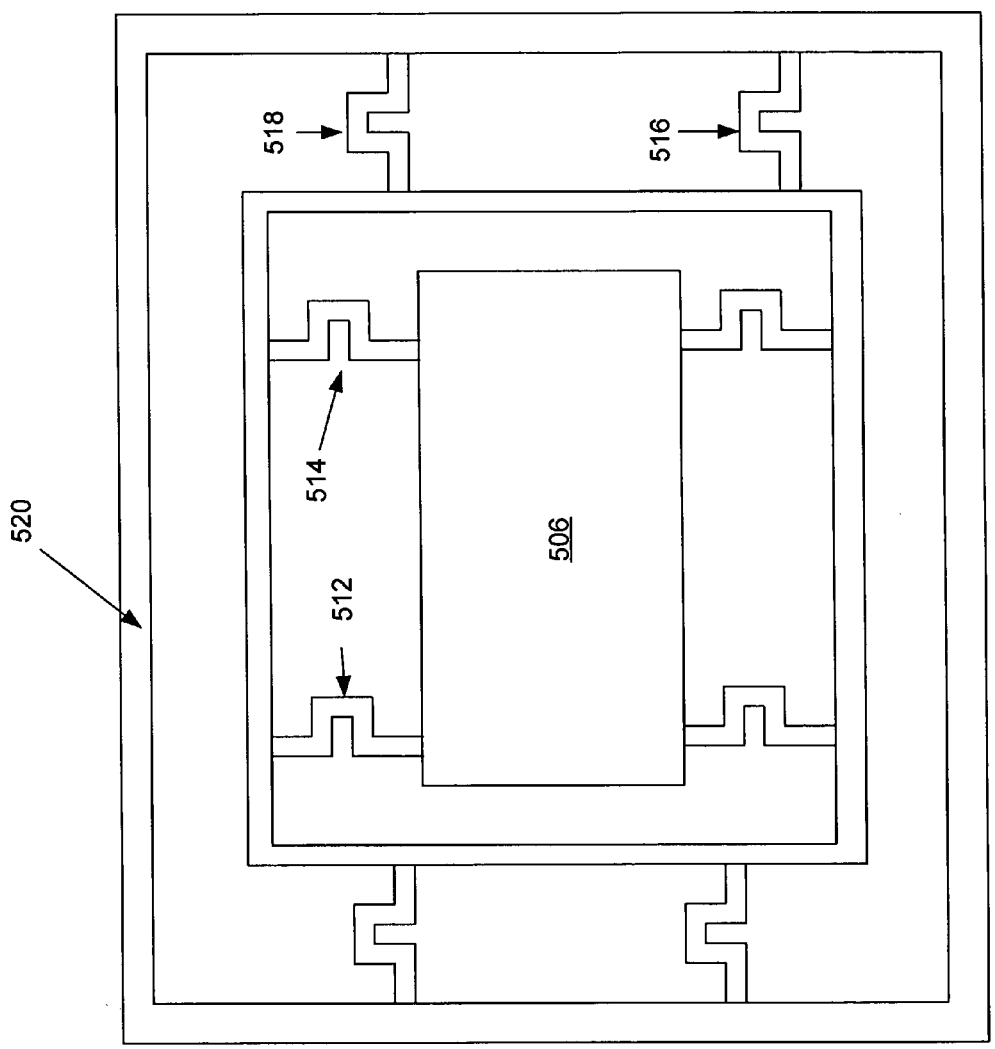
FIG. 5 shows a top-view of atomic resolution storage and associated micro-mover structure.

FIG. 5 shows a top-view of atomic resolution storage and associated micro-mover structure. FIG. 5 illustrates the storage medium 506 (and anodes in some configurations) being held by two sets of flexible serpentine-shaped micro-fabrication beams. The faces of a first set of flexible serpentine-shaped beams are in the Y-Z plane, such as 512 and 514. The 512, 514 set of flexible serpentine-shaped beams can be flexed in the Y direction allowing the medium to move in the Y direction with respect to casing 520. The faces of a second set of thin-walled beams are in the X-Z plane, such as 516, 518. The second set of beams 516, 518 allow the medium to move in the X direction with respect to the casing 520. The medium is held by the first set of beams, which are connected to a frame 522. The frame 522 is held by the second set of beams, which are connected to the casing 520. The electron emitters scan over the medium 506, or the medium 506 scans over the electron emitters in the X-Y directions by electrostatic, electromagnetic or piezoelectric forces as is known in the art. In this example, the micro-mover includes holding and moving the storage medium relative to the electron emitters.

ARS micro-movers are set forth and described in U.S. Pat. Nos. 5,557,596, 6,704,267 and are herein incorporated by reference.

Writing can be accomplished by temporarily increasing the power density of the electron beam current to modify the surface state of the storage area. Reading can be accomplished by observing the effect of the storage area on the electron beams, or the effect of the electron beams on the storage area.

Combined ARS Storage and Tube Amplification

Figure 6:
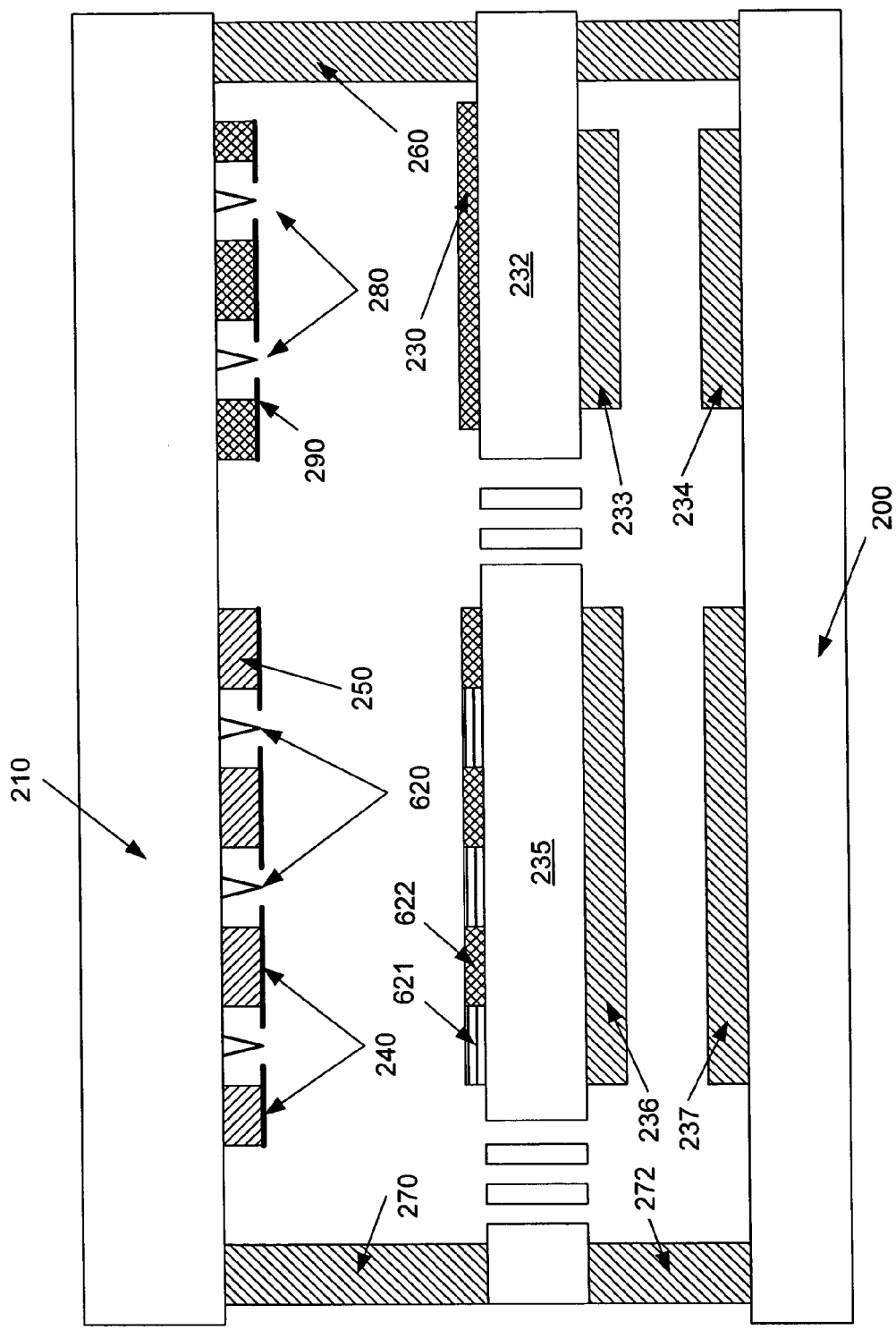
FIG. 6 shows another embodiment of a vacuum tube amplifier and associated atomic resolution storage (ARS) located within a common vacuum.

FIG. 6 shows another embodiment of a vacuum tube amplifier and associated atomic resolution storage (ARS) located within a common vacuum. FIG. 6 includes storage areas 621 and at least some anodes 622 that are co-located. That is, the storage areas 621 and the anodes 622 are "intermixed". Depending upon the positioning of the micro-mover 235, electrodes 620 are used for memory purposes (reading or writing from a storage area 621), or for tube amplification purposes. The storage areas 621 and the anodes 622 can be configured in many different ways. An exemplary configuration includes a checker board of storage areas 621 and anodes 622. Determination as to whether electron beams from the electrodes 220 are being used for memory purposes or for amplification is determined by the position of the micro-mover 235. Again, the controls for the micro-mover can be on either the first substrate 200, or the second substrate 210.

Drive electrodes 236, 237 enable precise movement of the micro-mover 235 providing alignment of the electron emitters 620 to storage areas 621 or anodes 622. The drive electrodes 236, 237 can be implemented to form a stepper motor as is known in the art. Controls of the micro-mover can be located within the second substrate 200, and operate to align the electron emitters over precise storage areas of the storage medium 621, allowing data to be stored and read from each of many storage areas of the storage medium 621, or over anodes for signal amplification.

The first set of electron emitters 620 are used for both signal amplification and memory storage. The second set of electron emitters 280 is used for signal amplification. Selection of emitters and uses of the emitters can be controlled by circuitry located in either the first substrate 200 or the second substrate 210.

Figure 7:
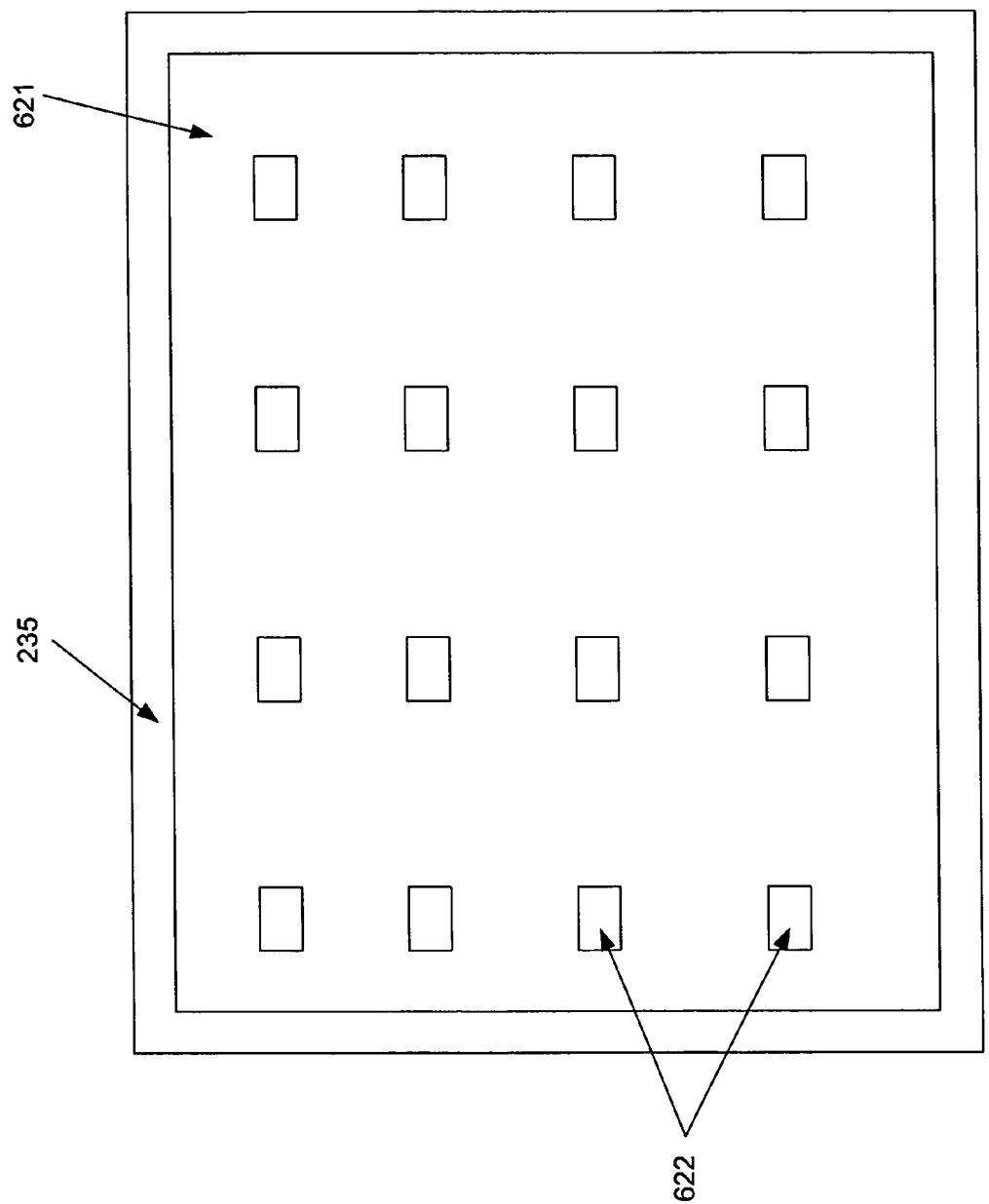
FIG. 7 shows a top-view of intermixed storage areas and anodes.

FIG. 7 shows a top-view of intermixed storage areas 621 and anodes 622. As previously stated, precise movement of the micro-mover 235 provides alignment of the electron emitters 620 to storage areas 621 or anodes 622. As shown in FIG. 7, typically, the intermixed storage areas 621 occupy a much greater amount of surface area than the anodes 622. Generally, there is a greater desire for a large amount memory than there is for many anodes. The anodes 622 need only occupy a small area because the electron beam has a small diameter. In general, the electron beam diameter is smaller than the minimum lithographic feature size that can be produced. Therefore, the area of the anodes 622 is typically determined by the minimum feature size of the lithographic processes used to produce the anodes 622.

Figure 8:
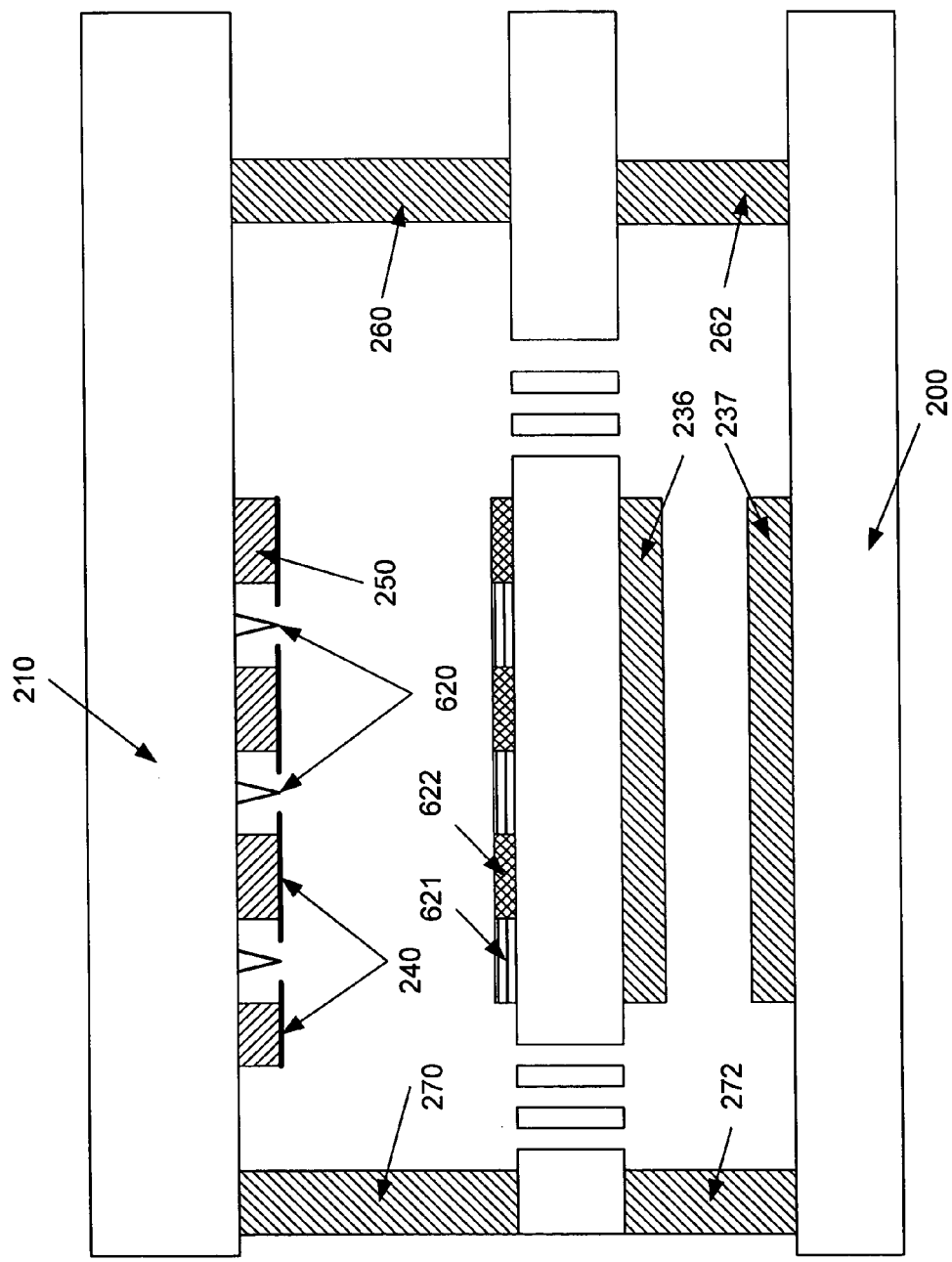
FIG. 8 shows another embodiment of a vacuum tube amplifier and associated atomic resolution storage (ARS) located within a common vacuum.

FIG. 8 shows another embodiment of a vacuum tube amplifier and associated atomic resolution storage (ARS) located within a common vacuum. The embodiment includes mixed storage areas 621 and anodes 622. The electron emitters 220 can provide storage within the storage areas 621, or provide tube amplification when used in conjunction with the anodes 622 and the grid elements 240.

This embodiment does not include electron emitters dedicated exclusively to tube amplification or exclusively to memory storage. The determination of which emitters are providing memory storage, and which emitters are providing tube amplification is controllable by circuitry within the first substrate 200 and the second substrate 210. Generally, emitters are arranged so that during operation, the emitters are dedicated to either memory storage, or signal amplification.

The mixed storage areas 621 and anodes 622 can be formed with standard semiconductor etching a deposition processes. More specifically, either the storage areas or the anodes can be formed by deposition and etching, and then the other of the storage areas or anodes is deposited. As previously described, typically the storage areas occupy a substantially greater amount of surface area than the anodes 622.

Figure 9:
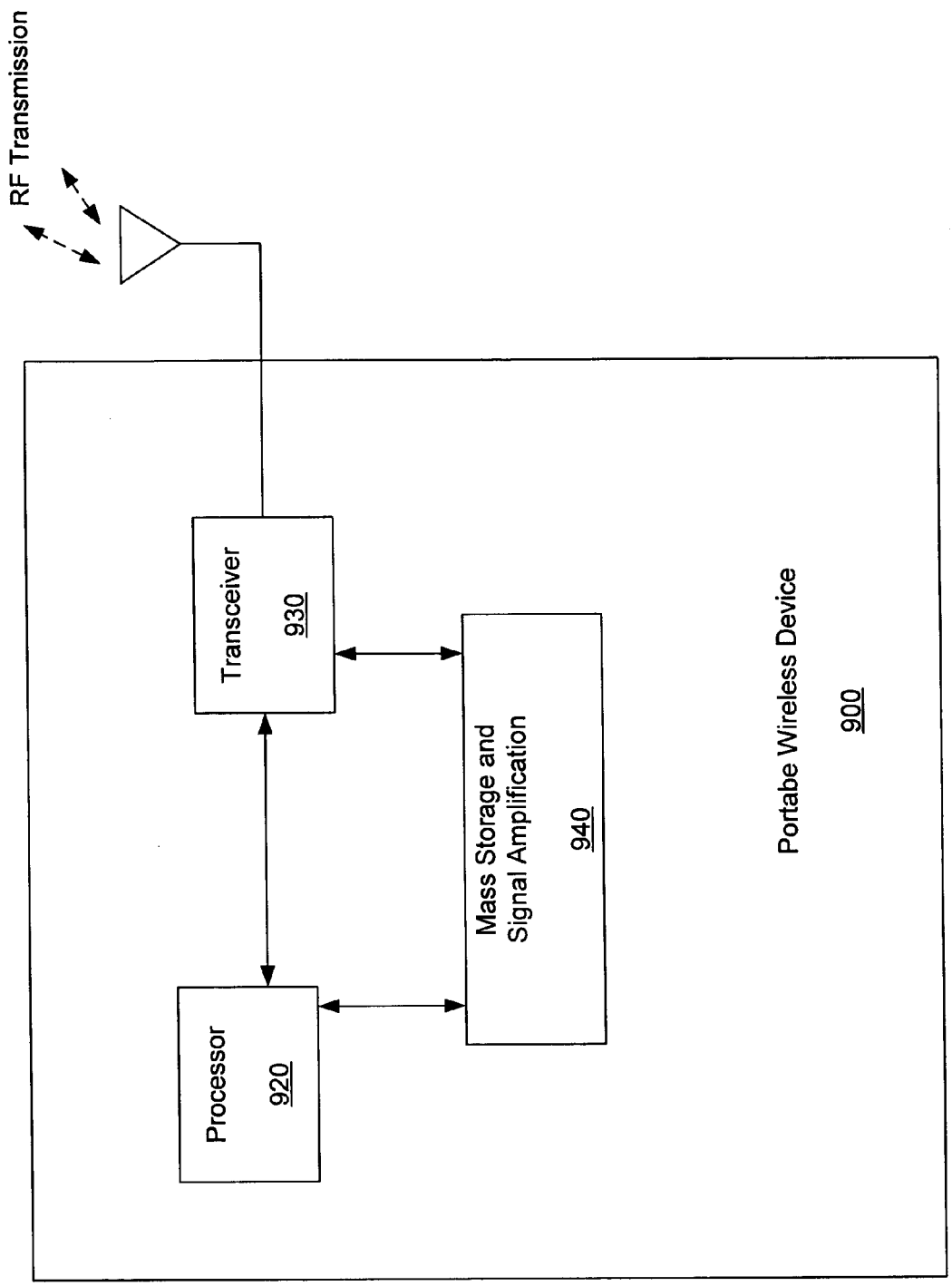
FIG. 9 shows a portable wireless device that includes a vacuum tube amplifier and associated atomic resolution storage (ARS) located within a common vacuum.

FIG. 9 shows a portable wireless device 900 that includes a vacuum tube amplifier and associated atomic resolution storage (ARS) located within a common vacuum. The wireless device 900 includes some type of microprocessor 920 that controls a transceiver that transmits and receives wireless information signals. The processor 920 also controls a mass storage and signal amplification device 940. The storage and signal amplification device 940 can be similar to the storage and amplification devices shown in FIGS. 2, 6 and 8.

FIG. 10 is a flow chart that includes steps of a method for storing data and amplifying electronic signals within a common vacuum structure. A first step 1010 includes storing data in a phase change medium that is proximate to the electron emitters by exposing the phase change medium to an electron beam current to change a state of the phase change medium. A second step 1020 includes amplifying an electronic signal by applying the electronic signal to a grid that controls a magnitude of current flowing between the electron emitters and a cathode that receives electrons from the electron emitters.

Although specific embodiments of the invention have been described and illustrated, the invention is not to be limited to the specific forms or arrangements of parts so described and illustrated. The invention is limited only by the appended claims.

What is claimed is:

1. A memory storage and amplification apparatus comprising:
   an electron emitter;
   a storage medium for receiving an electron beam from the electron emitter, the storage medium having a storage area, the storage area being in one of a plurality of states as determined by the electron beam generated by the electron emitter;
   an anode for also receiving the electron beam from the electron emitter, causing an electrical current to flow between the anode and the electron emitter; and
   a lens that modulates a magnitude of the electrical current flowing between the anode and the electron emitter.

2. The memory storage and amplification apparatus of claim 1, wherein the lens is a grid.

3. The memory storage and amplification apparatus of claim 1, wherein the electron emitter is formed adjacent to a first substrate, and electronic circuitry of at least one of the first substrate and a second substrate controls amplification of a communications signal by providing signal control of the lens, thereby controlling current conducted between the electron emitter and the anode, generating an amplified version of the communications signal.

4. The memory storage and amplification apparatus of claim 1, further comprising a plurality of electron emitters, wherein at least one of the electron emitters determines the states of the storage area, and at least one of the electron emitters controllably causes the electrical current to flow between the anode and the electron emitters.

5. The memory storage and amplification apparatus of claim 4, further comprising a plurality of storage areas on the storage medium, and a plurality of anodes.

6. The memory storage and amplification apparatus of claim 5, wherein the plurality of storage areas and the plurality of anodes are intermixed.

7. The memory storage and amplification apparatus of claim 6, wherein a surface area of the storage areas is greater than a surface area of the anodes.

8. The memory storage and amplification apparatus of claim 6, wherein a surface area of each anode is determined by a spot size of electron beams generated by a single electron emitter.

9. The memory storage and amplification apparatus of claim 5, wherein the plurality of storage areas and the plurality of anodes are separately located.

10. The memory storage and amplification apparatus of claim 5, further comprising a micro-fabricated mover to change relative positions between electron emitters and the storage areas so that different storage areas can be bombarded by electron current beams.

11. The memory storage and amplification apparatus of claim 1, wherein the storage medium is made of a phase-change material such that one state of the storage area is crystalline, another state of the storage area is amorphous, and the storage area can be changed from one state to another by controlling the magnitude of the power density of the electron beam current bombarding the storage area.

12. The memory storage and amplification apparatus of claim 1, wherein the electron emitter, the storage medium, the anode and the lens are contained within a vacuum formed by a first substrate, a second substrate and spacers between the first and second substrates.

\* \* \* \* \*